US006362652B1

(12) United States Patent
Oner et al.

(10) Patent No.: US 6,362,652 B1
(45) Date of Patent: Mar. 26, 2002

(54) HIGH VOLTAGE BUFFER FOR SUBMICRON CMOS

(75) Inventors: Mustafa Ertugrul Oner, Santa Clara; Sumer Can, Cupertino, both of CA (US)

(73) Assignee: Fujitsu Microelectronics, Inc., San Jose, CA (US)

( * ) Notice: Subject to any disclaimer, the term of this patent is extended or adjusted under 35 U.S.C. 154(b) by 0 days.

(21) Appl. No.: 09/467,367

(22) Filed: Dec. 20, 1999

(51) Int. Cl.$^7$ ............................................. H03K 19/0185
(52) U.S. Cl. ............................. 326/81; 326/68; 326/83
(58) Field of Search ............................. 326/63, 68, 80, 326/81, 83, 86

(56) References Cited

U.S. PATENT DOCUMENTS

| | | |
|---|---|---|
| 3,818,245 A | 6/1974 | Suzuki et al. |
| 4,109,163 A | 8/1978 | Cricchi et al. |
| 4,268,761 A | 5/1981 | Suzuki et al. |

(List continued on next page.)

OTHER PUBLICATIONS

Edwin G. Goodell, et al.. "A Modular Hermetic Power Motor Controller", USA Official Proceedings of the Twenty–First International Power Conversion Conference, pp. 119–130, Oct. 1990.

Srinivasa R. Vemuru, "TTL–CMOS Input Buffers with no Static Power Dissipation", 1996 IEEE International Symposium on Circuits and Systems, Circuits and Systems Connecting the World, ISCAS 96 (Cat. No. 96CH35876), pp. 201–204, vol. 4, New York, New York.

Chi–Chang Wang, et al., "A 3.3–V/5–V Low Power TTL–to–CMOS Input Buffer", IEEE Journal of Solid–State Circuits, pp. 598–603, vol. 33, No. 4, Apr. 1998.

Changsik Yoo et al., "A Static Power Saving TTL–to–CMOS Input Buffer", IEEE Journal of Solid–State Circuits, pp. 616–620, vol. 30, No. 5, May 1995.

*Primary Examiner*—Michael Tokar
*Assistant Examiner*—Don Phu Le
(74) *Attorney, Agent, or Firm*—Christie, Parker & Hale, LLP

(57) ABSTRACT

An input circuit allows input buffers fabricated using submicron CMOS technologies to receive input signals having a voltage swing of 5V. The input circuit uses a cascode transistor to bias the drain of the input transistor so that the $V_{GD}$ of the input transistor does not reach or exceed the gate-oxide breakdown voltage. Outputs of the input buffers have a maximum voltage that is limited by their respective supply voltages.

26 Claims, 9 Drawing Sheets

CHARGE-DOWN CIRCUIT

U.S. PATENT DOCUMENTS

| | | | |
|---|---|---|---|
| 4,437,025 A | 3/1984 | Liu et al. | |
| 4,543,499 A | 9/1985 | Kaneko et al. | |
| 4,581,551 A | 4/1986 | Campbell, Jr. | |
| 4,625,129 A | 11/1986 | Ueno | |
| 4,675,557 A | 6/1987 | Huntington | |
| 4,689,504 A | 8/1987 | Raghunathan et al. | |
| 4,794,282 A | 12/1988 | Colles | |
| 4,798,981 A | 1/1989 | Tsugaru et al. | |
| 4,847,522 A | 7/1989 | Fuller et al. | |
| 4,849,660 A | 7/1989 | Hayashi et al. | |
| 4,929,852 A | 5/1990 | Bae | |
| 4,963,766 A | 10/1990 | Lundberg | |
| 4,978,871 A | 12/1990 | Jordan | |
| 4,985,646 A | 1/1991 | Kumagai et al. | |
| 4,996,452 A | 2/1991 | Yee et al. | |
| 5,023,448 A | 6/1991 | Gunning | |
| 5,117,131 A | 5/1992 | Ochi et al. | |
| 5,124,585 A | 6/1992 | Kim et al. | |
| 5,159,216 A * | 10/1992 | Taylor et al. | 326/115 |
| 5,172,016 A | 12/1992 | Dobberpuhl | |
| 5,223,751 A | 6/1993 | Simmons et al. | |
| 5,304,872 A | 4/1994 | Avraham et al. | |
| 5,352,942 A | 10/1994 | Tanaka et al. | |
| 5,410,267 A | 4/1995 | Haycock et al. | 326/81 |
| 5,422,523 A | 6/1995 | Roberts et al. | 326/68 |
| 5,424,659 A | 6/1995 | Stephens et al. | 326/81 |
| 5,440,249 A | 8/1995 | Schucker et al. | 326/81 |
| 5,444,392 A | 8/1995 | Sommer et al. | 326/31 |
| 5,444,397 A | 8/1995 | Wong et al. | 326/81 |
| 5,455,532 A | 10/1995 | Bass | 327/306 |
| 5,465,054 A | 11/1995 | Erhart | 326/34 |
| 5,473,268 A | 12/1995 | Declerq et al. | 326/80 |
| 5,543,733 A | 8/1996 | Mattos et al. | 326/81 |
| 5,543,734 A | 8/1996 | Volk et al. | 326/83 |
| 5,546,019 A | 8/1996 | Liao | 326/81 |
| 5,583,454 A | 12/1996 | Hawkins et al. | 326/81 |
| 5,604,449 A | 2/1997 | Erhart et al. | 326/81 |
| 5,646,550 A | 7/1997 | Campbell, Jr. et al. | 326/81 |
| 5,656,951 A | 8/1997 | Hu et al. | 326/81 |
| 5,767,697 A | 6/1998 | Ueno et al. | 326/80 |
| 5,821,799 A | 10/1998 | Saripella | 327/333 |
| 5,838,168 A | 11/1998 | Petersen | 326/81 |
| 5,867,052 A | 2/1999 | Austin et al. | 327/333 |
| 5,880,605 A | 3/1999 | McManus | 326/86 |
| 5,880,617 A | 3/1999 | Tanaka et al. | 327/333 |
| 5,914,617 A * | 6/1999 | Bartlett | 326/81 |
| 5,952,848 A * | 9/1999 | Morris | 326/81 |
| 6,104,229 A * | 8/2000 | Lien | 326/81 |
| 6,150,853 A * | 11/2000 | Chrappan et al. | 327/108 |

\* cited by examiner

CHARGE-UP CIRCUIT

HIGH VOLTAGE BUFFER

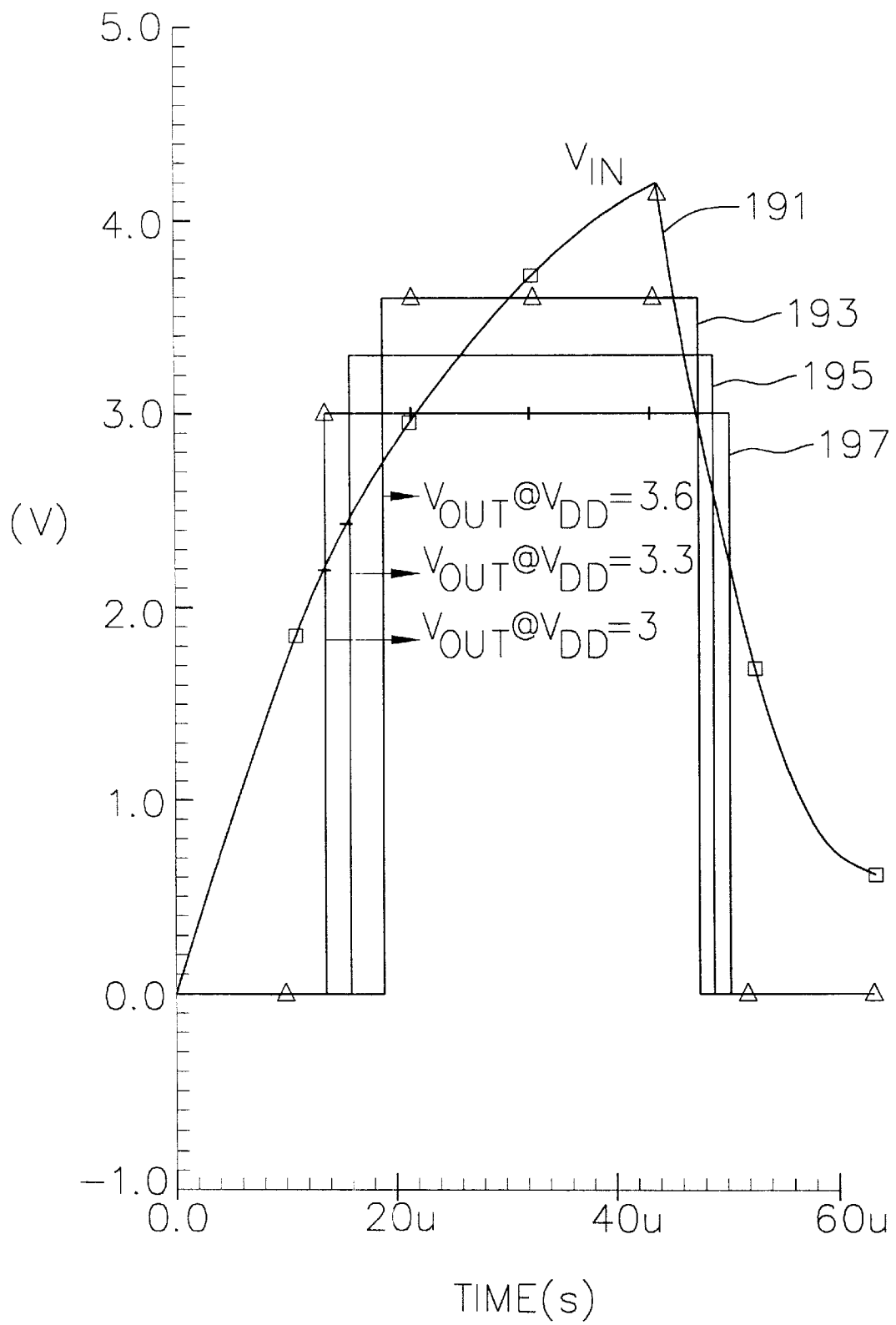

HIGH VOLTAGE BUFFER FOR SUBMICRON CMOS

BACKGROUND OF THE INVENTION

The present invention relates generally to CMOS devices, and more particularly to a method and apparatus for allowing a submicron CMOS input buffer to receive an input signal having a voltage swing of 5V.

Conventionally 5V CMOS technologies have been used to fabricate analog and digital integrated circuits (ICs) that operate with a 5V supply voltage and input signals having a voltage swing of 5V. Advances in CMOS fabrication technologies allow fabrication of CMOS devices that are smaller in size than conventional 5V CMOS devices. The CMOS technologies for fabricating devices that are smaller in size than the conventional 5V CMOS devices are generally referred to as submicron CMOS technologies, and such devices are called submicron CMOS devices.

Submicron CMOS devices typically have an advantage of occupying a smaller area on an integrated circuit chip. This allows for increased logic density. Due to smaller sizes, the submicron CMOS devices generally use supply voltages that are lower than 5V. The submicron CMOS devices generally also require that input signals have a voltage swing of less than 5V.

Submicron CMOS devices with maximum allowable supply voltages of 3.3V and 2.5V have been fabricated. Providing an input signal having a high voltage swing, a maximum of which is higher than the maximum allowable supply voltage, to a submicron CMOS device, may result in a voltage breakdown (gate-oxide breakdown) of the submicron CMOS device. For example, CMOS devices fabricated using 0.25 $\mu$ CMOS technology generally operate with a maximum allowable supply voltage of 3.3V, and have a gate-oxide breakdown voltage of 3.6V. Thus, if an input signal having a voltage swing of more than 3.6V is provided to a 0.25 $\mu$ CMOS device, a voltage breakdown may occur.

Due to their smaller size and lower power consumption requirements, use of submicron CMOS devices typically results in smaller ICs and cost savings. However, voltage compatibility problems often arise because 5V CMOS devices are still being used concurrently. When 5V CMOS devices and submicron CMOS devices are used on the same board, more than one supply voltage having different voltage levels are generally needed. In addition, high voltage, e.g. 5V, swing signals generated by the 5V CMOS devices generally are not provided directly to the inputs of the submicron CMOS devices. This is due to the potential for voltage breakdown of the submicron CMOS devices upon receiving high voltage.

One method of providing supply voltages having different voltage levels is to use a separate voltage regulator to convert a 5V supply voltage to a supply voltage that is compatible with submicron CMOS devices. Such voltage regulators have been integrated into the submicron CMOS devices. The amount of area on the IC required to incorporate a voltage regulator is generally compensated by the increased density of IC chips fabricated using the submicron CMOS technologies. However, using voltage regulators is generally ineffective when the submicron CMOS devices are required to accept input signals having a high-voltage, e.g. 5V, swing.

One solution for reducing high-voltage swing at the input of the submicron CMOS devices is use of a resistor-based voltage divider. However, a resistor-based voltage divider has an associated power consumption and increases system loading. To decrease power consumption and loading effect, the size of the resistor generally needs to be large. Use of large resistors on integrated circuits is generally undesirable because large resistances occupy a large area of an IC chip.

SUMMARY OF THE INVENTION

The present invention is an input buffer fabricated using a submicron CMOS technology that is capable of receiving an input voltage swing of 5V.

One embodiment of the present invention is an integrated circuit comprising an input transistor and a bias transistor coupled to the input transistor. The input transistor receives an input signal having a voltage swing of a first range of voltages. The maximum of the first range of voltages is greater than or equal to a gate-oxide breakdown voltage of the input transistor. The bias transistor is a cascode transistor that controls internal voltage differences of the input transistor to be within a second range of voltages. The maximum of the second range of voltages is less than the gate-oxide break down voltage of the input transistor.

Another embodiment of the present invention is a buffer circuit comprising a charge down circuit, a charge up circuit and a current source circuit. The charge down circuit receives an input signal, generates a charge down signal to pull down an output of the buffer circuit to logic low. The charge up circuit receives the input signal, and generates a charge up signal to pull up the output of the buffer circuit to logic high. The current source circuit is coupled to the charge down circuit and the charge up circuit. The current source circuit includes a plurality of reference current sources, and provides reference currents to the charge down circuit and the charge up circuit.

Yet another embodiment of the present invention is a class-AB push-pull buffer circuit fabricated using submicron CMOS technologies.

Yet another embodiment of the present invention is a method of providing a high voltage input signal to an integrated circuit that includes the following steps: the high voltage input signal is provided at a gate of an input transistor; the input transistor is coupled to a bias transistor, which is a cascode transistor that controls voltage at a drain of the input transistor; and a selected bias voltage is provided to the bias transistor to control the voltage at the drain of the input transistor. The bias voltage is used to limit voltages within the input transistor to be less than a gate-oxide breakdown voltage for the input transistor.

Many of the attendant features of this invention will be more readily appreciated as the same becomes better understood by reference to the following detailed description considered in connection with the accompanying drawings.

DESCRIPTION OF THE DRAWINGS

FIG. 9 is a timing diagram of output responses to an input signal $V_{in}$ of the joystick circuit of FIG. 8.

DETAILED DESCRIPTION OF THE INVENTION

Figure 1:
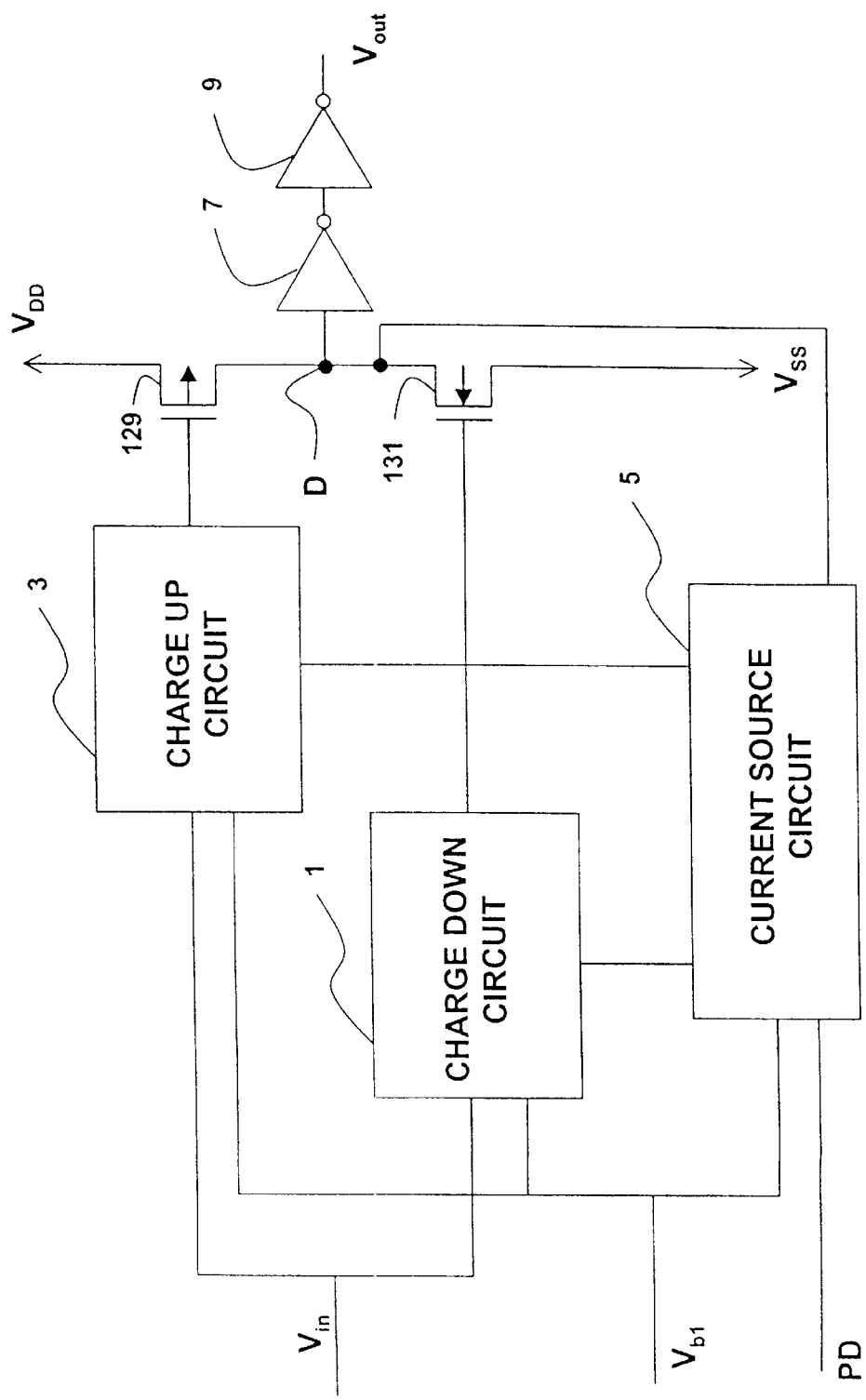
FIG. 1 is a block diagram of a preferred embodiment of the present invention, a 5V input tolerant class-AB push-pull buffer circuit for a submicron CMOS device.

FIG. 1 is a block diagram of a 5V input tolerant class-AB push-pull buffer circuit for a submicron CMOS device. The buffer circuit receives an input signal $V_{in}$ from a 5V CMOS device or another device that generates an output with a voltage swing of 5V. The buffer circuit includes a charge up circuit 3 and a charge down circuit 1 for receiving input signals. The charge up circuit and the charge down circuit provide inputs to a charge up transistor 129 and a charge down transistor 131, respectively. Thus, the buffer circuit uses the input signal $V_{in}$ provided to the charge down circuit 1 and the charge up circuit 3 to generate an output $V_{out}$ having a voltage swing of a supply voltage $V_{DD}$.

When the input signal $V_{in}$ is higher than a predetermined trip voltage $V_{trip}$, the charge down circuit 1 is not activated and does not provide an output. When the input signal $V_{in}$ is lower than the trip voltage $V_{trip}$, the charge down circuit 1 is activated, and the charge down circuit 1 provides a charge down signal as an output. The trip voltage $V_{trip}$, which will be described in detail later on, is preferably selected to be greater than 2.0V. The charge down signal is provided to a charge down transistor 131.

The charge down transistor 131 is an NMOS transistor that turns on when a logic high signal is applied at a gate. A source of the charge down transistor 131 is coupled to a common voltage $V_{SS}$. A drain of the charge down transistor 131 is coupled to node D. Thus, when the charge down transistor 131 is turned on, i.e., when the charge down circuit 1 provides a logic high charge down signal at the gate of the charge down transistor, node D is pulled down towards the common voltage $V_{SS}$. An output generated at node D is provided as the output $V_{out}$ of the buffer circuit through inverters 7 and 9 that are coupled in series.

When the input signal $V_{in}$ is lower than a predetermined trip voltage $V_{trip}$, the charge up circuit 3 is not activated and does not provide an output. When the input signal $V_{in}$ is higher than the trip voltage $V_{trip}$, the charge up circuit 3 is activated, and the charge up circuit 3 provides a charge up signal as an output. The charge up signal is provided to a charge up transistor 129.

The charge up transistor 129 is a PMOS transistor that turns on when a logic low signal is applied at a gate. A source of the charge up transistor 129 in coupled to the supply voltage $V_{DD}$. A drain of the charge up transistor 129 is coupled to node D. Thus, when the charge up circuit 3 provides a logic low charge up signal at the gate of the charge up transistor, the charge up transistor turns on and pulls up node D high towards the supply voltage $V_{DD}$. The supply voltage $V_{DD}$ preferably is 3.3V. In alternate embodiments, the supply voltage $V_{DD}$ may be 3.0V, 3.6V, or any other suitable voltage that is compatible with submicron CMOS devices.

A current source circuit 5 receives a first bias voltage $V_{b1}$, which is also provided to the charge up circuit and the charge down circuit. The current source circuit provides reference currents to the charge down circuit 1 and the charge up circuit 3. In addition, the current source circuit 5 receives a power down signal PD. The current source circuit 5 uses the power down signal PD to pull down node D towards the common voltage $V_{SS}$, thus pulling down the output $V_{out}$ of the buffer circuit to logic low, regardless of the values of the input signal $V_{in}$ and the bias voltage $V_{b1}$. In the preferred embodiment, the output $V_{out}$ is pulled down towards the common voltage $V_{SS}$ when the power down signal PD is logic high.

Figure 2:
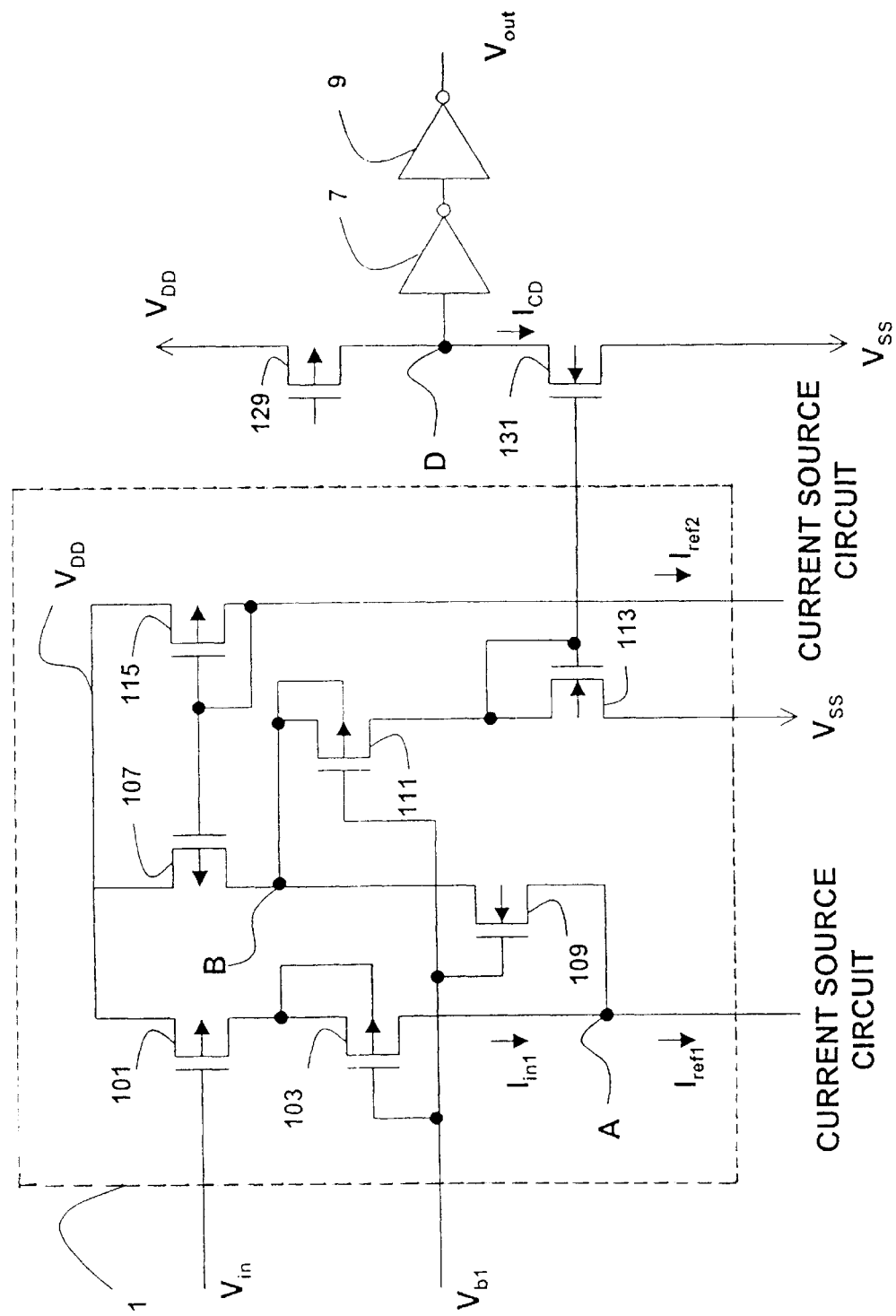
FIG. 2 is a charge-down circuit for the 5V input tolerant class-AB push-pull buffer circuit of FIG. 1.

FIG. 2 is a detailed circuit diagram of an embodiment of the charge down circuit. An input signal $V_{in}$ is provided to a gate of a first input transistor 101. A source of the first input transistor 101 is coupled to the supply voltage $V_{DD}$. A drain of the first input transistor is coupled to a source and a substrate of a first bias transistor 103. The first input transistor 101 and the first bias transistor 103 are PMOS transistors.

The first bias transistor 103 is a cascode transistor that is used to bias the drain of the first input transistor 101 so that $V_{GD}$, i.e., the voltage between the gate and the drain of the first input transistor 101, does not exceed a gate-oxide breakdown voltage. A gate of the first bias transistor 103 receives the first bias voltage $V_{b1}$ as an input. The first bias voltage $V_{b1}$ is selected such that the voltage at the source of the first bias transistor 103, i.e., the voltage applied at the drain of the first input transistor 101, ensures that the maximum $V_{GD}$ of the first input transistor is less than the gate-oxide breakdown voltage.

For example, suppose the first input transistor 101 has a gate-oxide breakdown voltage of 3.6V. In this case, the drain of the first input transistor needs to be biased so that $V_{GD}$ does not exceed 3.6V. Thus, when the input signal $V_{in}$ has a 5V voltage swing, the first bias voltage $V_{b1}$ is selected so that the voltage applied at the drain of the first input transistor 101 is at least +1.4V. Then, the maximum $V_{GD}$ does not exceed 3.6V.

A voltage level at node A determines whether the charge down circuit 1 is activated or not. When the voltage level at node A is logic high, the charge down circuit is activated. On the other hand, when the voltage level at node A is logic low, the charge down circuit is deactivated.

A current source circuit provides an approximately constant first reference current $I_{ref1}$ at node A, and thereby tends to pull down voltage at node A. Node A preferably is a high impedance node that tends to be pulled high or low depending on relative magnitudes of the first input current $I_{in1}$ and the first reference current $I_{ref1}$. If $I_{in1} > I_{ref1}$, node A tends to be pulled high, i.e., charged up. If $I_{in1} < I_{ref1}$, node A tends to be pulled low, i.e., charged down.

A trip voltage $V_{trip}$ is defined to be the voltage of the input signal when $I_{in1} = I_{ref1}$. Thus, when the input signal $V_{in}$ is less than the trip voltage $V_{trip}$, then a first input current $I_{in1}$ supplied by the first input transistor 101 is larger than the first reference current $I_{ref1}$. When the first input current $I_{in1}$ is larger than the first reference current $I_{ref1}$, charge builds up at node A, and the voltage at node A increases.

Node A is also coupled to a source of a transistor 109. The transistor 109 is an NMOS transistor. A gate of the transistor 109 is coupled to the first bias voltage $V_{b1}$. A drain of the transistor 109 is coupled to a drain of a current transistor 107 at node B. A source of the current transistor 107 is coupled to the supply voltage $V_{DD}$. A gate of the current transistor 107 is coupled to a gate and a drain of a current mirror transistor 115. The drain of the current mirror transistor 115 is also coupled to a current source circuit which provides an approximately constant second reference current $I_{ref2}$. A source of the current mirror transistor 115 is coupled to the supply voltage $V_{DD}$.

The current transistor 107 and the current mirror transistor 115 comprise a current mirror. In other words, the current through the current transistor 107 mirrors the current through the current mirror transistor 115. Since the second reference current $I_{ref2}$ flows through the current mirror transistor 115, a current with approximately the same magnitude as $I_{ref2}$ flows through the current transistor 107, provided that the current transistor 107 and the current mirror transistor 115 have approximately the same dimensions.

When the voltage at node A increases due to $I_{in1}$ being greater than $I_{ref1}$, the voltage applied at the source of the transistor 109 increases, and the transistor 109 turns off. When the transistor 109 turns off, the voltage at node B increases. A source and a substrate of a transistor 111 is coupled to node B. The transistor 111 turns on as the voltage at node B increases towards the supply voltage $V_{DD}$. A drain and a gate of a current mirror transistor 113 is coupled to a drain of the transistor 111. A source of the current mirror transistor 113 is coupled to the common voltage $V_{SS}$. Thus, the current mirror transistor 113 is configured as a diode. Therefore, when the transistor 111 turns on, the current through the current transistor 107 flows through the transistor 111 and the current mirror transistor 113.

A gate of a charge down transistor 131 is coupled to the drain and the gate of the current mirror transistor 113. Thus, the current mirror transistor 113 and the charge down transistor 131 comprise a current mirror. In other words, the current through the charge down transistor 131 mirrors the current through the current mirror transistor 113. Therefore, as the current flows through the current mirror transistor 113, provided that the current mirror transistor 113 and the charge down transistor 131 have approximately the same dimensions, a charge down current $I_{CD}$ of approximately equal magnitude flows through the charge down transistor 131, pulling down the voltage at node D. When node D is pulled down to logic low, the buffer circuit provides a logic low output $V_{out}$.

Therefore, when the input signal $V_{in}$ is less in magnitude than the trip voltage $V_{trip}$, i.e., $I_{in1} > I_{ref1}$, node A is pulled high. When node A is pulled high, the transistor 109 turns off, and node B is pulled high. When node B is pulled high, current flows through transistor 111, current mirror transistor 113 and the charge down transistor 131. When current flows down through the charge down transistor 131, node D is pulled low, and the buffer circuit generates a logic low output $V_{out}$.

On the other hand, when the input signal $V_{in}$ is greater in magnitude than the trip voltage $V_{trip}$, i.e., $I_{in1} < I_{ref1}$, node A is pulled low and the transistor 109 is turned on. When the transistor 109 is turned on, node B is pulled low, turning off the transistor 111. Thus, approximately no current flows through the transistor 111 and the current mirror transistor 113. since the charge down current $I_{CD}$ mirrors the current through the current mirror transistor 113, approximately no charge down current $I_{CD}$ flows down from node D through the charge down transistor 131. Thus, the charge down circuit 1 has no substantial effect on the output $V_{out}$ of the buffer circuit when the voltage level of the input signal $V_{in}$ is higher than the trip voltage $V_{trip}$.

Figure 3:
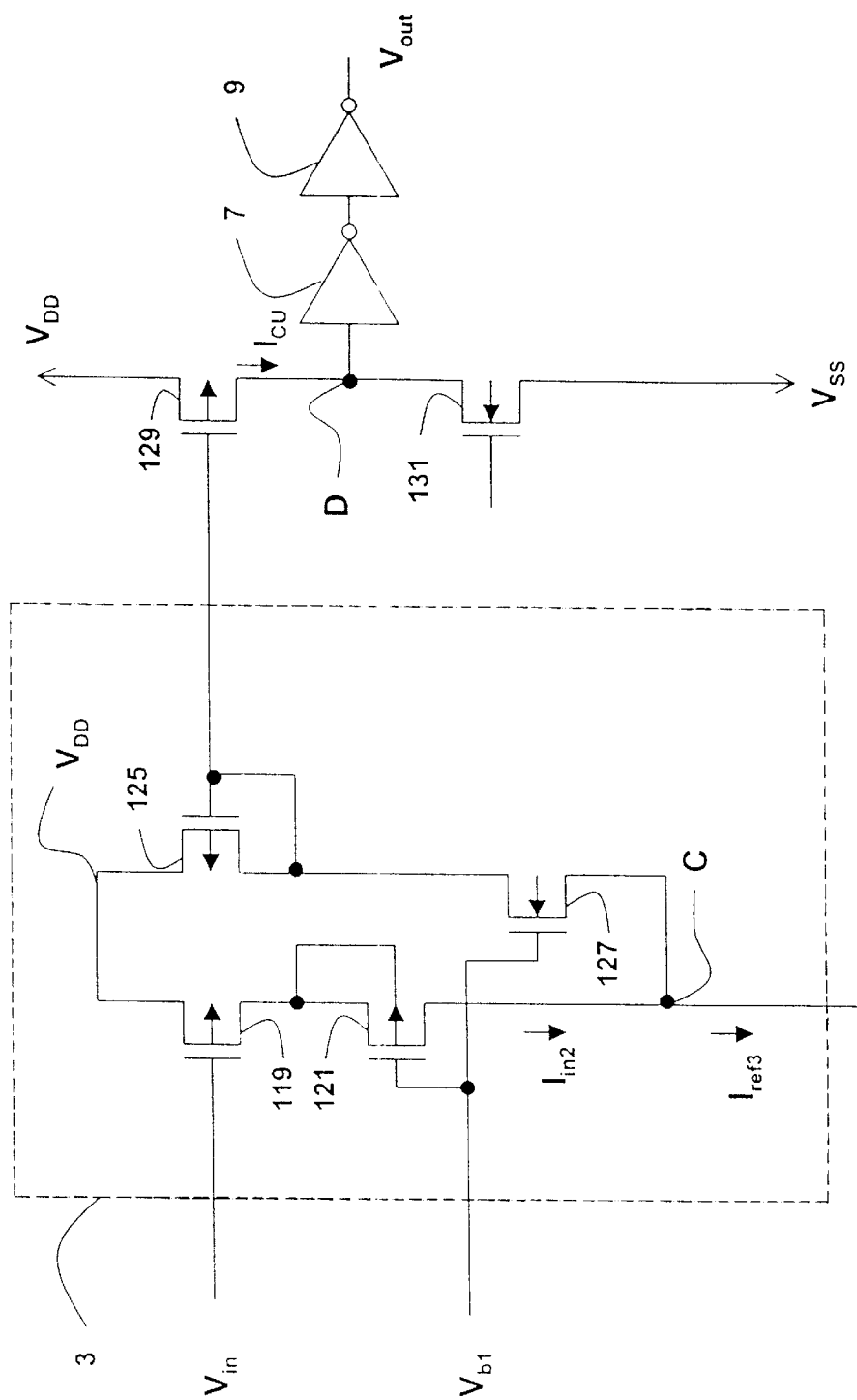
FIG. 3 is a charge-up circuit for the 5V input tolerant class-AB push-pull buffer circuit of FIG. 1.

FIG. 3 is a detailed circuit diagram of an embodiment of the charge up circuit. The input signal $V_{in}$ is provided to a gate of a second input transistor 119. A source of the second input transistor 119 is coupled to a supply voltage $V_{DD}$. A drain of the second input transistor 119 is coupled to a source and a substrate of a second bias transistor 121.

The second bias transistor 121 is a cascode transistor that is used to bias the drain of the second input transistor 119 so that $V_{GD}$, i.e., the voltage between the gate and the drain of the second input transistor 119, does not exceed a gate-oxide breakdown voltage. A gate of the second bias transistor 121 receives the first bias voltage $V_{b1}$ as an input. The first bias voltage $V_{b1}$ is selected such that the voltage at the source of the second bias transistor 121, i.e., the voltage applied at the drain of the second input transistor 119, ensures that the maximum $V_{GD}$ of the second input transistor is less than the gate-oxide breakdown voltage.

For example, suppose the second input transistor 119 has a gate-oxide breakdown voltage of 3.6V. In this case, the drain of the second input transistor needs to be biased so that $V_{GD}$ does not exceed 3.6 V. Thus, when the input signal $V_{in}$ has a 5V voltage swing, the first bias voltage $V_{b1}$ is selected so that the voltage applied at the drain of the second input transistor 119 is at least +1.4V. Then, the maximum $V_{GD}$ does not exceed 3.6V.

A voltage level at node C determines whether the charge up circuit 3 is activated or not. When the voltage level at node C is logic low, the charge up circuit is activated. On the other hand, when the voltage level at node C is logic high, the charge up circuit is deactivated.

A current source circuit provides an approximately constant third reference current $I_{ref3}$ at node C, and thereby tends to pull down voltage at node C. Node C preferably is a high impedance node that tends to be pulled high or low depending on relative magnitudes of the second input current $I_{in2}$ and the third reference current $I_{ref3}$. If $I_{in2} > I_{ref3}$, node C tends to be pulled high, i.e., charged up. If $I_{in2} < I_{ref3}$, node C tends to be pulled low, i.e., charged down.

Node C is also coupled to a source of a transistor 127. A gate of the transistor 127 is coupled to the first bias voltage $V_{b1}$. A drain of the transistor 127 is coupled to a drain and a gate of a current mirror transistor 125. A source of the current mirror transistor 125 is coupled to the supply voltage $V_{DD}$. The voltage at the gate and the drain of the current mirror transistor 125 is provided as an output of the charge up circuit to a gate of a charge up transistor 129. The source of the charge up transistor 129 is coupled to the supply voltage $V_{DD}$. The current mirror transistor 125 and the charge up transistor 129 comprise a current mirror. In other words, a charge up current $I_{CU}$ through the charge up transistor 129 mirrors a current through the current mirror transistor 125.

When the charge up current $I_{CU}$ flows down through the charge up transistor 129, node D is pulled up, i.e., voltage at node D increases towards the supply voltage $V_{DD}$. Thus, when the charge up current $I_{CU}$ has positive magnitude, a high level voltage at node D is provided as a logic high output $V_{out}$ of the buffer circuit through inverters 7 and 9 that are coupled in series.

When the voltage level of the input signal $V_{in}$ is higher than $V_{trip}$, the second input current $I_{in2}$ supplied by the second input transistor 119 is smaller than the third reference current $I_{ref3}$, and thus the voltage at node C decreases. As the voltage at node C decreases, the transistor 127 is turned on, and current flows through the transistor 127 and the current mirror transistor 125. Since the charge up current $I_{CU}$ mirrors the current through the current mirror transistor 125, the magnitude of the charge up current $I_{CU}$ is approximately equal to the magnitude of the current that flows through the current mirror transistor 125, provided that the current mirror transistor 125 and the charge up transistor 129 have approximately the same dimensions. Therefore, when the magnitude of the input signal $V_{in}$ is higher than $V_{trip}$, the charge up circuit is activated and results in logic high output $V_{out}$ of the buffer circuit.

When the voltage level of the input voltage $V_{in}$ is lower than the trip voltage $V_{trip}$, the magnitude of the second input current $I_{in2}$ is greater than the magnitude of the third reference current $I_{ref3}$, and thus the voltage level at node C increases. When node C is at logic high, the transistor 127 turns off, and approximately no current flows through the transistor 127 and the current mirror transistor 125. With approximately no current flowing through the current mirror transistor 125, approximately no current flows through the charge up transistor 129, and the charge up circuit 3 is effectively turned off.

Figure 4:
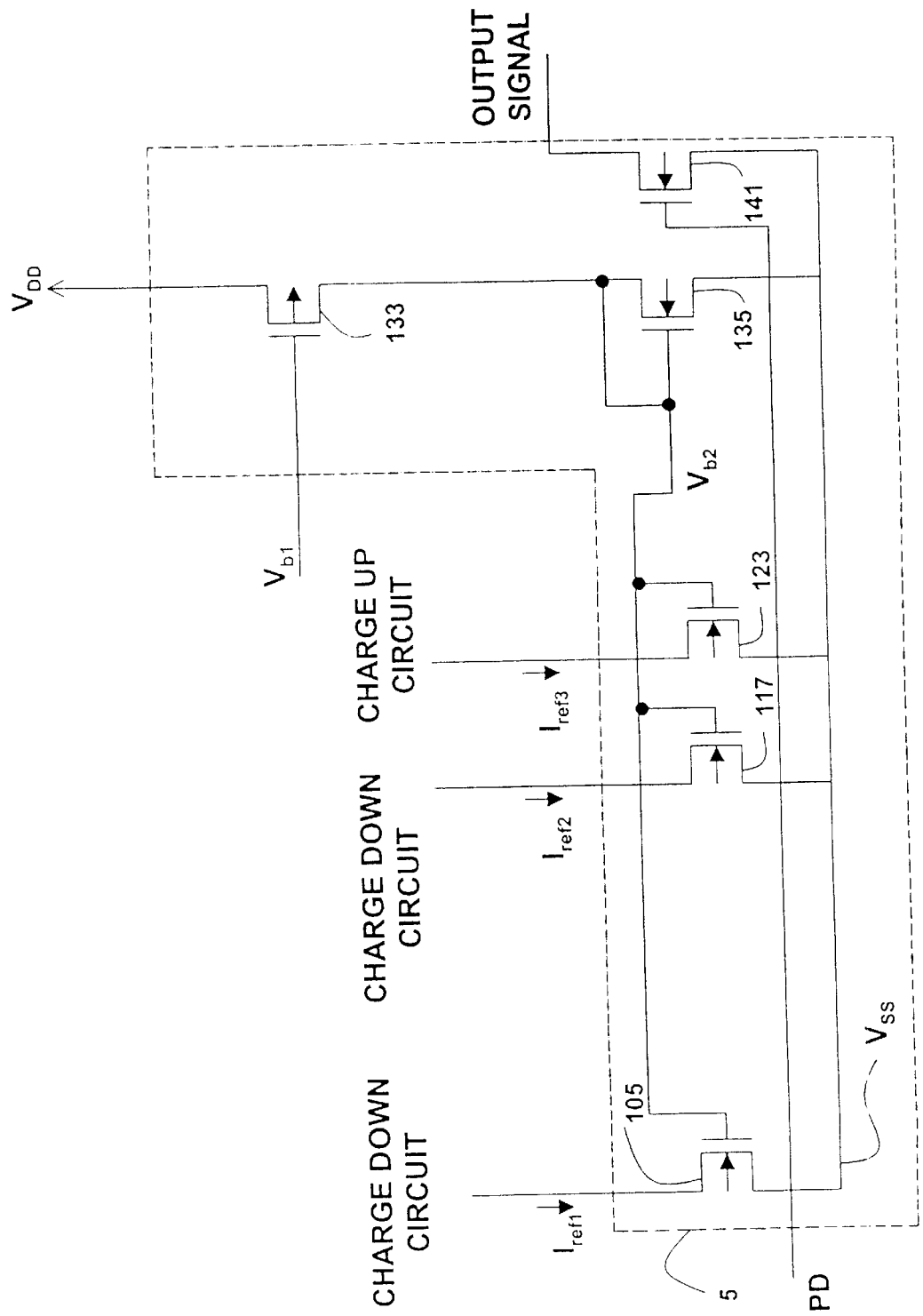
FIG. 4 is a current source circuit for the 5V input tolerant class-AB push-pull buffer circuit of FIG. 1.

FIG. 4 is a detailed circuit diagram of an embodiment of the current source circuit 5. A power down signal PD is coupled to a gate of a power down transistor 141. The power down transistor 141 is an NMOS transistor. A source of the power down transistor 141 is coupled to a common voltage $V_{SS}$. A drain of the power down transistor is coupled to an output signal of the buffer circuit. Thus, when the power down signal PD is at logic high, the power down transistor 141 turns on, and the output signal of the buffer circuit is pulled low regardless of the input signal $V_{in}$. Therefore, the power down signal PD is used to pull down the output signal of the buffer circuit to logic low.

A first bias voltage is received at a gate of a third bias transistor 133. The third bias transistor 133 is a PMOS transistor. A source of the third bias transistor 133 is coupled to a supply voltage $V_{DD}$. A drain of the third bias transistor 133 provides the second bias voltage $V_{b2}$. The second bias voltage $V_{b2}$ is applied at a gate of a first reference transistor 105, a gate of a second reference transistor 117, a gate of a third reference transistor 123, and a drain and a gate of a current mirror transistor 135. Sources of the reference transistors 105, 117, 123, and a source of the current mirror transistor 135 are coupled to the common voltage $V_{SS}$. The reference transistors 105, 117, 123 and the current mirror transistor 135 are NMOS transistors.

Thus, the current mirror transistor 135 is configured as a diode, and the current flowing through the second bias transistor 13 and the current mirror transistor 135 are controlled by the first bias voltage $V_{b1}$. Further, the current mirror transistor 135 and each of the reference transistors 105, 117 and 123 comprise a current mirror so that the reference transistors 105, 117 and 123 mirror the current mirror transistor 135. In other words, current through each of the reference transistors 105, 117 and 123 are approximately equal in magnitude to the current through the current mirror transistor 135, provided that dimensions of the reference transistors 105, 117 and 123 are approximately equal to the dimensions of the current mirror transistor 135.

Drains of the first and second reference transistors 105 and 117 are coupled to a charge down circuit and are used to provide first and second reference currents $I_{ref1}$ and $I_{ref2}$, respectively. A drain of the third reference transistor 123 is coupled to a charge up circuit and is used to provide a third reference current $I_{ref3}$.

Figure 5:
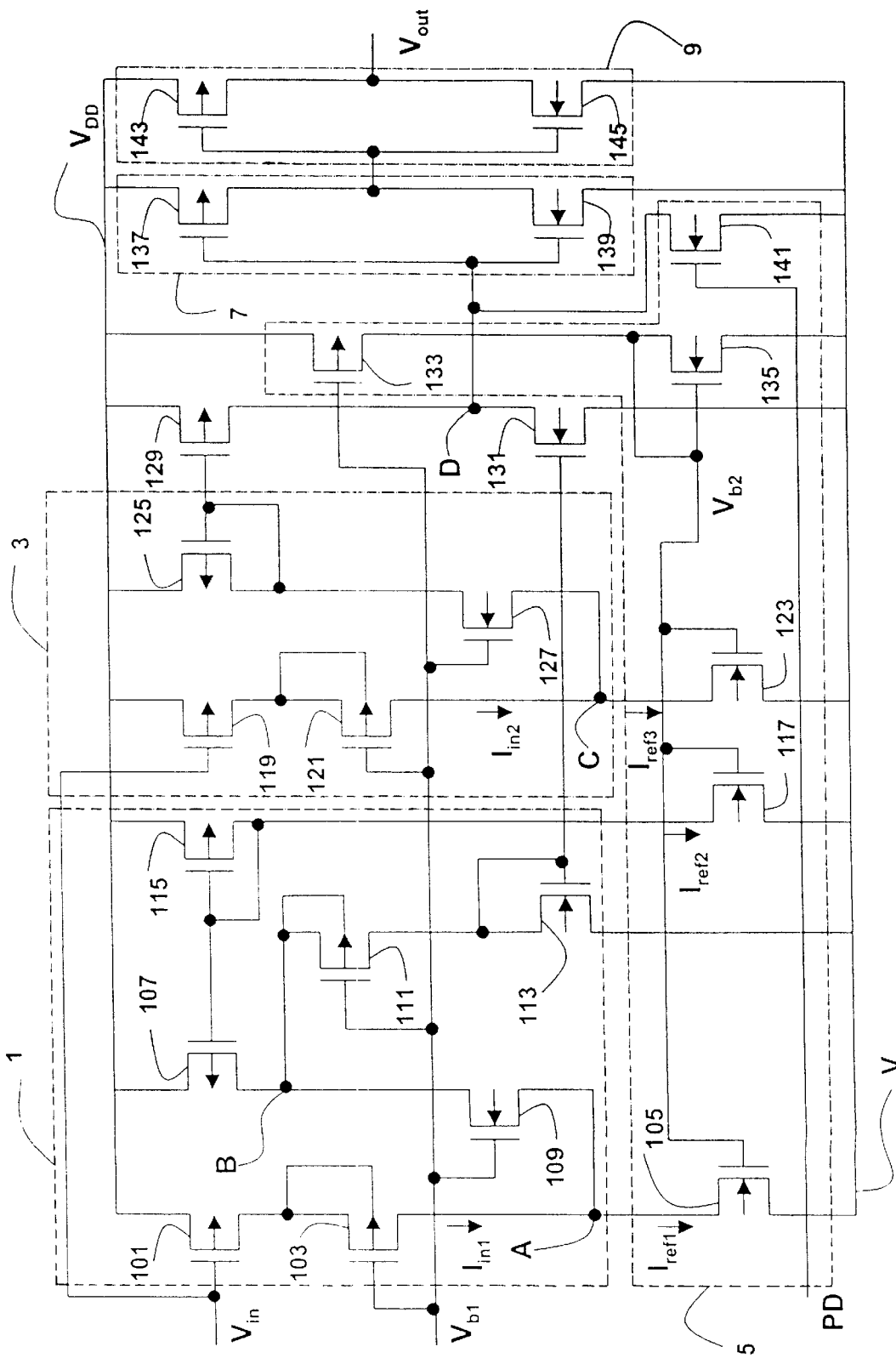
FIG. 5 is a detailed circuit diagram of the 5V input tolerant class-AB push-pull buffer circuit of FIG. 1.

FIG. 5 is a detailed circuit diagram of a 5V input tolerant class-AB push-pull buffer circuit for a submicron CMOS device of an embodiment of the present invention. The 5V input tolerant class-AB push-pull buffer circuit is comprised of a charge down circuit 1, a charge up circuit 3, a current source circuit 5, a charge up transistor 129, a charge down transistor 131, and inverters 7, 9.

The charge down circuit 1 is comprised of transistors 101, 103, 107, 109, 111, 113 and 115. The charge down circuit 1 has been described in detail with reference to FIGS. 1 and 2. The charge up circuit 3 is comprised of transistors 119, 121, 125 and 127. The charge up circuit 3 has been described in detail with reference to FIGS. 1 and 3. The current source circuit 5 is comprised of transistors 105, 117, 123, 133, 135 and 141. The current source circuit 5 has been described in detail in reference to FIGS. 1 and 4.

The inverter 7 is comprised of transistors 137 and 139. The transistor 137 is a PMOS transistor and the transistor 139 is an NMOS transistor. An output signal at node D is coupled to gates of both the transistors 137 and 139. A source of the transistor 137 is coupled to the supply voltage $V_{DD}$. A drain of the transistor 137 is coupled to a drain of the transistor 139. The drains of the transistors 137 and 139 provide an inverted output signal to the inverter 9 as an input. A source of the transistor 139 is coupled to a common voltage $V_{SS}$.

The inverter 9 is comprised of a PMOS transistor 143 and an NMOS transistor 145, and has a similar configuration as the inverter 7. The inverter 9 receives the inverted output signal from the inverter 7 as an input, and inverts the inverted output signal to generate an output $V_{out}$ of the buffer circuit.

Figure 6:
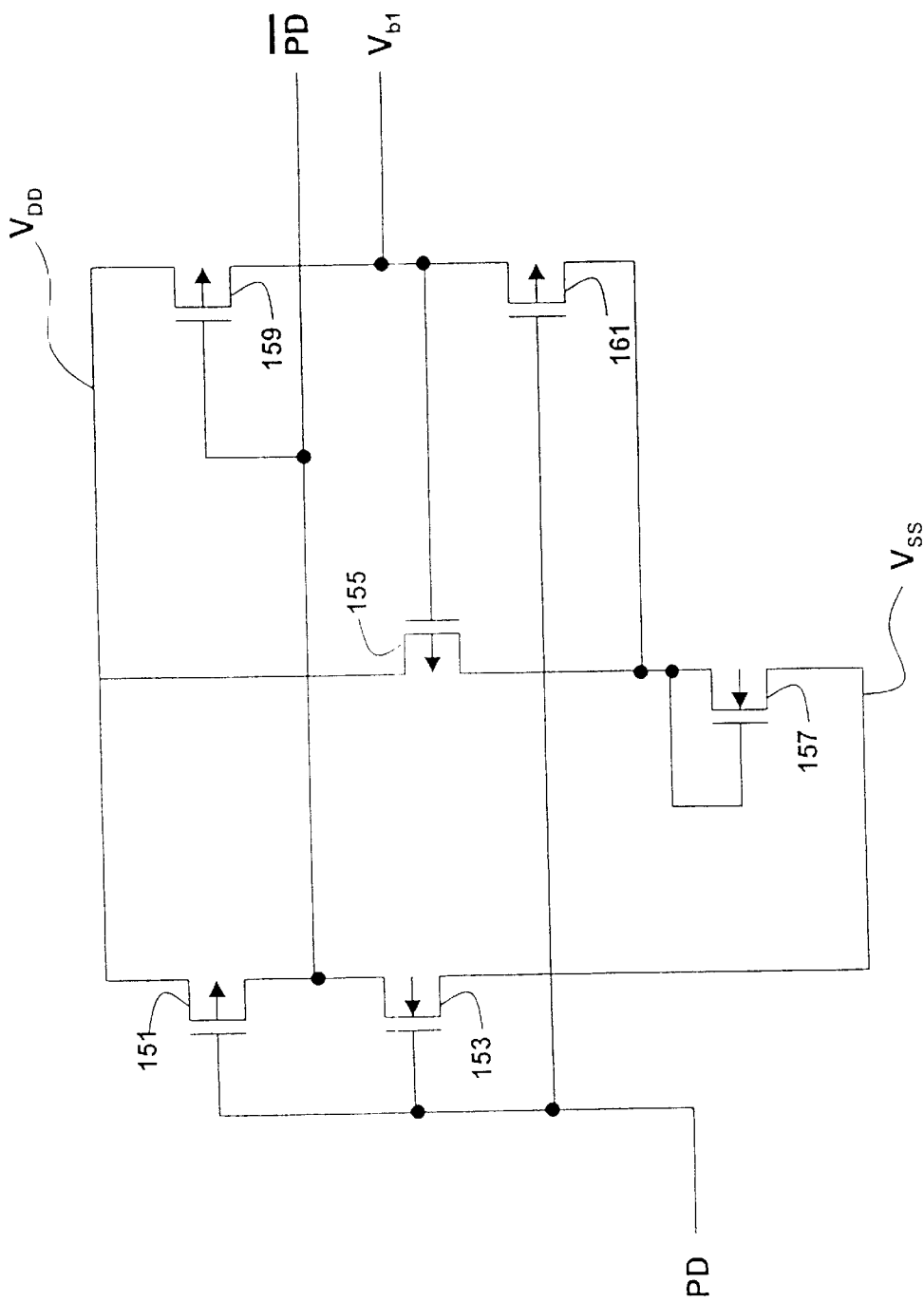
FIG. 6 is a circuit diagram of a first bias circuit that may be used to supply a bias voltage $V_{b1}$ to the 5V input tolerant class-AB push-pull buffer circuit of FIG. 1.

FIG. 6 is a detailed circuit diagram of a first bias circuit that generates a first bias voltage $V_{b1}$, which is provided to the buffer circuit. A power down signal PD is provided at gates of transistors 151 and 153. The PMOS transistor 151 and the NMOS transistor 153 comprise an inverter that provides an inverted power down signal as one of the outputs of the first bias circuit. A source of the PMOS transistor 151 is coupled to a supply voltage $V_{DD}$. A source of the NMOS transistor 153 is coupled to a common voltage $V_{SS}$. A source of the PMOS transistor 151 and a drain of the NMOS transistor 153 are coupled to each other and provide the inverted PD signal as an output of the inverter.

The inverted PD signal is coupled to a gate of a PMOS transistor 159. A source of the PMOS transistor 159 is coupled to the supply voltage $V_{DD}$. When the power down signal PD is logic low, the inverted power down signal PD is logic high, and the PMOS transistor 159 is turned off. A drain of the PMOS transistor 159 is coupled to a gate of a PMOS transistor 155 and a source of a PMOS transistor 161 at a node that provides the first bias voltage $V_{b1}$.

A gate of the PMOS transistor 161 is coupled to the power down signal PD. Thus, when the power down signal PD is logic low, the PMOS transistor 161 is turned on. A drain of the PMOS transistor 161 is coupled to a drain of a PMOS transistor 155 and a drain and a gate of an NMOS transistor 157. A source of the PMOS Transistor 155 is coupled to the supply voltage $V_{DD}$, and a source of the NMOS transistor 157 is coupled to the common voltage $V_{SS}$. Thus, the PMOS transistor 155 and the NMOS transistor 157 are coupled as a voltage divider between the supply voltage $V_{DD}$ and the common voltage $V_{SS}$. Therefore, when the power down signal PD is low, the first bias voltage $V_{b1}$ is determined by a ratio between the dimensions of the PMOS transistor 155 and the NMOS transistor 157.

When the power down signal PD is logic high, the inverted PD signal is logic low. Thus, when the inverted PD signal is received at the gate of the PMOS transistor 159, the PMOS transistor 159 is turned on. When the PMOS transistor 159 is turned on, the first bias voltage $V_{b1}$ approaches the supply voltage $V_{DD}$. As the first bias voltage $V_{b1}$ becomes approximately equal to the supply voltage $V_{DD}$, the PMOS transistor 155 is turned off since the first bias voltage $V_{b1}$ is coupled to the gate of the PMOS transistor 155.

In addition, when the power down signal PD is logic high, the PMOS transistor 161 is turned off since the power down signal PD is coupled to the gate of the PMOS transistor 161. Thus, when the power down signal PD is logic high, both the PMOS transistor 155 and the PMOS transistor 161 are turned off as well as the PMOS transistor 151. Therefore, when the power down signal PD is logic high, approximately no current flows from the supply voltage VDD to the common voltage $V_{SS}$ within the first bias circuit, and so the first bias circuit is effectively turned off.

Figure 7:
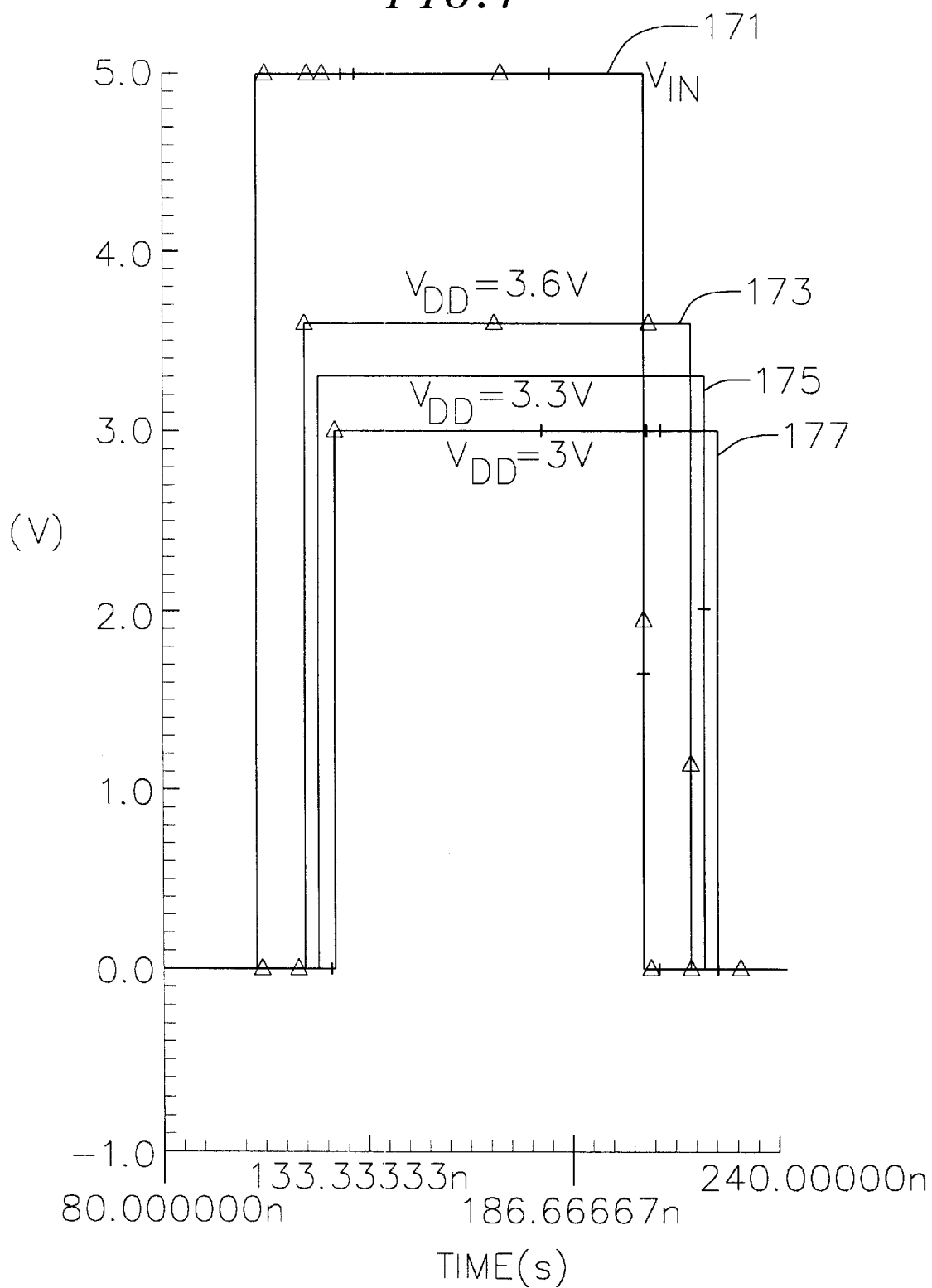
FIG. 7 is a timing diagram of output responses to an input signal of 5V pulse.

FIG. 7 is a timing diagram of an output response of the buffer circuit when an input signal $V_{in}$ 171 is a 5V input pulse of about 100 ns in duration. When the voltage level of a supply voltage is approximately 3.6V, the output response is a 3.6V output pulse 173, which is delayed from the 5V input pulse by about 10 ns. When the voltage level of the supply voltage is approximately 3.3V, the output response is a 3.3V output pulse 175, which is delayed from the 5V input pulse by about 15 ns. When the voltage level of the supply voltage is approximately 3.0V, the output response is a 3.0V output pulse 177, which is delayed from the 5V input pulse by about 20 ns.

Figure 8:
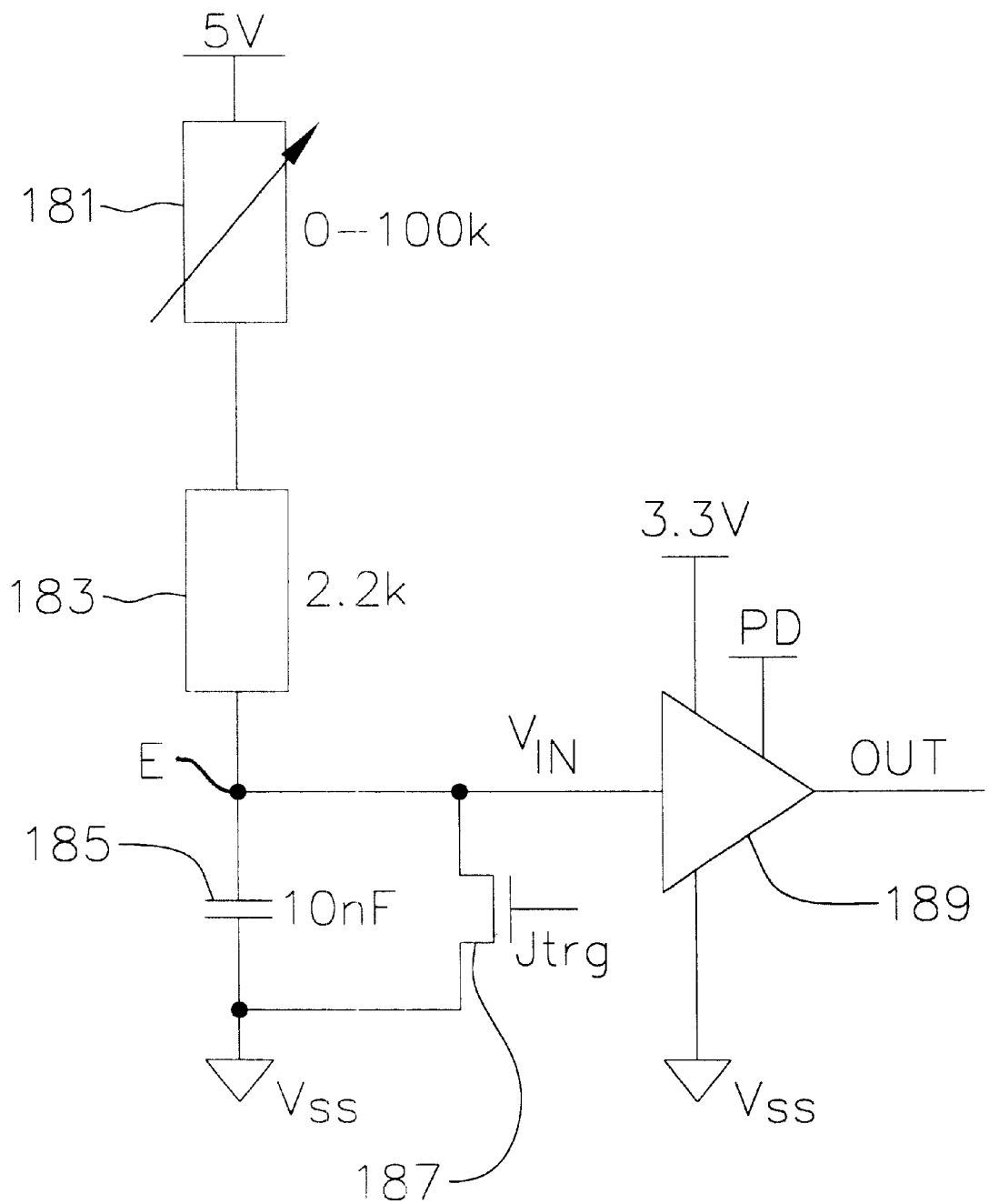
FIG. 8 is a block diagram of a joystick circuit which uses the buffer circuit of FIG. 1.

FIG. 8 is a block diagram of a joystick circuit which is one of the applications for the buffer circuit of the present invention. The joystick circuit includes an input buffer 189, which is one embodiment of the buffer circuit of the present invention. The input buffer 189 receives a supply voltage with the voltage level of 3.3V, a power down signal PD, and an input signal $V_{in}$ having a voltage swing of approximately 5V. The input buffer 189 is also coupled to a common voltage $V_{SS}$. Since the input buffer receives the 3.3V supply voltage, an output Out of the input buffer does not exceed 3.3V.

The joystick circuit further includes a variable resistor 181, a 2.2K ohm resistor 183, a 10 nF capacitor 185 and a transistor 187. The transistor 187 is an NMOS transistor. The variable resistor 181 varies in accordance with joystick movement. For example, forward movement of the joystick may result in a decreased resistance while backward movement of the joystick may result in an increased resistance. The resistance of the variable resistor ranges from 0 ohm to 100K ohm.

One end of the variable resistor 181 is coupled to a 5V voltage supply. The other end of the variable resistor 181 is coupled to one end of the 2.2K ohm resistor. The other end of the 2.2K ohm resistor is provided as the input signal $V_{in}$ of the input buffer 189. The input signal $V_{in}$ of the input buffer 189 is also coupled to one end of the 10 nF capacitor 185 and a drain of the transistor 187. The other end of the 10 nF capacitor is coupled to the common voltage $V_{SS}$.

The variable resistor 181, the 2.2K ohm resistor 183 and the 10 nF capacitor 185 comprise an RC circuit. The rise time of the input signal $V_{in}$ increases as the resistance of the variable resistor 181 increases. On the other hand, the rise time of the input signal $V_{in}$ decreases as the resistance of the variable resistor 181 decreases.

A source of the transistor 187 is coupled to the common voltage $V_{SS}$ while a gate of the transistor 187 is coupled to a joystick trigger signal Jtrg. The joystick trigger signal Jtrg is used to discharge the 10 nF capacitor 187. For example, when the joystick trigger signal Jtrg is made logic high, the transistor 187 turns on and pulls down node E, thereby discharging the 10 nF capacitor 185.

FIG. 9 is a typical timing diagram of the output of the input buffer of FIG. 8 in response to the input signal $V_{in}$ 191. The input signal $V_{in}$ has a rise time of about 40 μs to rise from the voltage level of approximately 0V to the voltage level of approximately 4.2V. When the voltage level of the input signal $V_{in}$ is approximately 4.2V, i.e., at about 40 μs, the joystick trigger signal Jtrg is made logic high to discharge the 10 nF capacitor coupled to the input signal $V_{in}$. When the logic high joystick trigger signal Jtrg is made logic high, the voltage level of the input signal $V_{in}$ decrease to approximately 0.6V in about 20 μs.

When a supply voltage $V_{DD}$ is approximately 3.6V, an output pulse 193 indicates that the trip voltage $V_{trip}$ is approximately 2.8V for low-to-high transition at about 18 μs. The trip voltage $V_{trip}$ for high-to-low transition at about 45 μs is also approximately 2.8V.

When the supply voltage $V_{DD}$ is approximately 3.3V, an output pulse 195 indicates that the trip voltage $V_{trip}$ is approximately 2.5V for low-to-high transition at about 15 μs. The trip voltage $V_{trip}$ for high-to-low transition at about 46 μis is also approximately 2.5V.

When the supply voltage $V_{DD}$ is approximately 3.0V, an output pulse 197 indicates that the trip voltage $V_{trip}$ is approximately 2.25V for low-to-high transition at about 13 μs. The trip voltage $V_{trip}$ for high-to-low transition at about 47 μs is approximately 2.2V.

As seen from FIG. 9, there are no substantial differences in the trip voltage $V_{trip}$ between the low-to-high transition and the high-to-low transition of the output responses in this embodiment. In other embodiments, the trip voltage $V_{trip}$ may be different for the low-to-high transition and the high-to-low transition.

Accordingly, the present invention provides a 5V input tolerant buffer circuit for a submicron CMOS device. Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents rather than the foregoing description.

What is claimed is:

1. An integrated circuit comprising:
   an input transistor receiving an input signal having a voltage swing of a first range of voltages, the maximum of the first range of voltages being greater than or equal to a gate-oxide breakdown voltage of the input transistor;
   a bias transistor coupled to the input transistor, the bias transistor controlling internal voltage differences of the input transistor to be within a second range of voltages, the maximum of the second range or voltages being less than the gate-oxide break down voltage of the input transistor; and
   a reference current source coupled to the bias transistor, wherein the bias transistor is coupled between the input transistor and the reference current source.

2. The integrated circuit of claim 1 wherein a source of the input transistor is coupled to a supply voltage, a gate of the input transistor is coupled to the input signal, and a drain of the input transistor is coupled to a source of the bias transistor, and the bias transistor is a cascode transistor that controls the voltage at the drain of the input transistor.

3. The integrated circuit of claim 2 wherein a gate of the bias transistor receives a bias voltage, a drain of the bias transistor is coupled to the reference current source, and the bias voltage controls the voltage at the drain of the input transistor.

4. The integrated circuit of claim 1 wherein the input transistor and the bias transistor are fabricated using a submicron CMOS technology.

5. The integrated circuit of claim 1 wherein the first range of voltages ranges from approximately 0V to approximately 5V, and the second range of voltages ranges from approximately 0V to approximately 3.6V.

6. A buffer circuit comprising:
   a charge down circuit receiving an input signal, the charge down circuit being used to generate a charge down signal to pull down an output of the buffer circuit to logic low:
   a charge up circuit receiving the input signal, the charge up circuit being used to generate a charge up signal to pull up the output of the buffer circuit to logic high; and
   a current source circuit coupled to the charge down circuit and the charge up circuit, the current source circuit providing reference currents to the charge down circuit and the charge up circuit,
      wherein the charge up circuit provides the charge up signal when the voltage level of the input signal is higher than a trip voltage, and the buffer circuit further comprises a charge up transistor wherein the charge up signal turns on the charge up transistor to pull up the output of the buffer circuit to logic high.

7. A buffer circuit comprising:
   a charge down circuit receiving an input signal, the charge down circuit being used to generate a charge down signal to pull down an output of the buffer circuit to logic low;
   a charge up circuit receiving the input signal, the charge up circuit being used to generate a charge up signal to pull up the output of the buffer circuit to logic high; and
   a current source circuit coupled to the charge down circuit and the charge up circuit, the current source circuit providing reference currents to the charge down circuit and the charge up circuit,
      wherein the charge down circuit comprises an input transistor receiving the input signal and a cascode transistor receiving a bias voltage, and wherein the bias voltage is selected to limit internal voltages of the input transistor to stay below a gate-oxide breakdown voltage of the input transistor.

8. The buffer circuit of claim 7 wherein the current source circuit provides one of the reference currents to the charge down circuit, and the charge down circuit provides the charge down signal when a magnitude of the provided one of the reference currents is lower than a magnitude of an input current, the input current is generated using the input signal and the input transistor.

9. The buffer circuit of claim 8 further comprising a charge down transistor wherein the charge down signal turns on the charge down transistor to pull down the output of the buffer circuit to logic low.

10. The buffer circuit of claim 9 wherein the charge down transistor is an NMOS transistor.

11. The buffer circuit of claim 7 wherein the charge down circuit provides the charge down signal when a voltage level of the input signal is lower than a trip voltage.

12. The buffer circuit of claim 7 wherein the charge up circuit provides the charge up signal when the voltage level of the input signal is higher than a trip voltage.

13. The buffer circuit of claim 7 further comprising a bias circuit that generates and provides the bias voltage, the bias circuit being coupled to at least one of the charge down circuit, the charge up circuit and the current source circuit.

14. A buffer circuit comprising:
   a charge down circuit receiving an input signal, the charge down circuit being used to generate a charge down signal to pull down an output of the buffer circuit to logic low;
   a charge up circuit receiving the input signal, the charge up circuit being used to generate a charge up signal to pull up the output of the buffer circuit to logic high; and
   a current source circuit coupled to the charge down circuit and the charge up circuit, the current source circuit providing reference currants, to the charge down circuit and the charge up circuit,
      wherein the charge up circuit comprises an input transistor receiving the input signal and a cascode transistor receiving a bias voltage, and wherein the bias voltage is selected to limit internal voltages of the input transistor to stay below a gate-oxide breakdown voltage of the input transistor.

15. The buffer circuit of claim 14 wherein the current source circuit provides one of the reference currents to the charge up circuit, and the charge up circuit provides the charge up signal when a magnitude of the provided one of the reference currents is lower than a magnitude of an input current, the input current is generated using the input signal and the input transistor.

16. The buffer circuit of claim 15 further comprising a charge up transistor wherein the charge up signal turns on the charge up transistor to pull up the output of the buffer circuit to logic high.

17. The buffer circuit of claim 16 wherein the charge up transistor is a PMOS transistor.

18. A buffer circuit comprising:
   a charge down circuit receiving an input signal, the charge down circuit being used to generate a charge down signal to pull down an output of the buffer circuit to logic low;
   a charge up circuit receiving the input signal, the charge up circuit being used to generate a charge up signal to pull up the output of the buffer circuit to logic high; and
   a current source circuit coupled to the charge down circuit and the charge up circuit, the current source circuit providing reference currents to the charge down circuit and the charge up circuit,
      wherein the charge down circuit provides the charge down signal when a voltage level of the input signal is lower than a trip voltage, and the buffer circuit further comprises a charge down transistors wherein the charge down signal turns on the charge down transistor to pull down the output of the buffer circuit to logic low.

19. A buffer circuit comprising:
   a charge down circuit receiving an input signal, the charge down circuit being used to generate a charge down signal to pull down an output of the buffer circuit to logic low;
   a charge up circuit receiving the input signal, the charge up circuit being used to generate a charge up signal to pull up the output of the buffer circuit to logic high; and
   a current source circuit coupled to the charge down circuit and the charge up circuit, the current source circuit providing reference currents to the charge down circuit and the charge up circuit,
      wherein the buffer circuit is a class-AB push-pull buffer circuit fabricated using submicron CMOS technologies.

20. The buffer circuit of claim 19 wherein the input signal has a voltage swing of approximately 5V.

21. A method of providing a high voltage input signal to an integrated circuit comprising:
   providing the high voltage input signal at a gate of an input transistor;
   coupling the input transistor to a bias transistor; and
   providing a selected bias voltage to the bias transistor to limit voltages within the input transistor to be less than a gate-oxide breakdown voltage for the input transistor; wherein the bias transistor is coupled between the input transistor and a reference current source.

22. The method of providing a high voltage input signal to an integrated circuit of claim 21 wherein the step of coupling the input transistor to a bias transistor comprises coupling a drain of the input transistor to a source of the bias transistor, and the bias transistor is used as a cascode transistor.

23. The method of providing a high voltage input signal to an integrated circuit of claim 22 wherein the step of providing a selected bias voltage to the bias transistor to limit voltages within the input transistor comprises coupling the bias voltage at a gate of the bias transistor, and using the bias voltage to control the voltage at the drain of the input transistor.

24. The method of providing a high voltage input signal to an integrated circuit of claim 21 wherein the integrated circuit is fabricated using submicron CMOS technologies.

25. The method of providing a high voltage input signal to an integrated circuit of claim 24 wherein a voltage level of the high voltage input signal ranges between approximately 0V and approximately 5V.

26. The method of providing a high voltage input signal to an integrated circuit of claim 25 wherein the gate-oxide breakdown voltage for the input transistor is approximately 3.6V.

* * * * *